United States Patent

Matsuda et al.

Patent Number: 6,143,597
Date of Patent: *Nov. 7, 2000

[54] METHOD OF MANUFACTURING CAPACITOR INCLUDED IN SEMICONDUCTOR DEVICE AND THE CAPACITOR THEREOF

[75] Inventors: Akihiro Matsuda; Yoshihisa Nagano, both of Suita; Toru Nasu, Kyoto; Koji Arita, Osaka; Yasuhiro Uemoto, Otsu, all of Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/678,866

[22] Filed: Jul. 12, 1996

[30] Foreign Application Priority Data

Jul. 14, 1995 [JP] Japan ...................... 7-178524

[51] Int. Cl.⁷ ...................... H01L 21/8242; H01L 21/108
[52] U.S. Cl. .............................. 438/240; 438/3; 257/295; 257/310
[58] Field of Search .................. 438/3, 240, 253, 438/254, 255, 396, 397, 398, 250, 393; 257/310, 295

[56] References Cited

U.S. PATENT DOCUMENTS

| | | | |
|---|---|---|---|
| 5,572,052 | 11/1996 | Kashihara et al. | 257/310 |
| 5,576,564 | 11/1996 | Satoh et al. | 257/295 |
| 5,635,741 | 6/1997 | Tsu et al. | 257/310 |
| 5,736,759 | 4/1998 | Haushalter | 257/295 |
| 5,757,061 | 5/1998 | Satoh et al. | 257/295 |
| 5,780,886 | 7/1998 | Yamanobe | 257/295 |

FOREIGN PATENT DOCUMENTS

| | | |
|---|---|---|
| 5-343345 | 12/1993 | Japan . |
| 5-347391 | 12/1993 | Japan . |
| 6-112543 | 4/1994 | Japan . |
| 6-119812 | 4/1994 | Japan . |

*Primary Examiner*—Carl Whitehead, Jr.
*Assistant Examiner*—Toniae M Thomas
*Attorney, Agent, or Firm*—McDermott, Will & Emery

[57] ABSTRACT

A method of manufacturing a capacitor comprises a step of forming a first dielectric layer composed of a ferroelectric material or a dielectric material possessing high permittivity on a first electrode, a step of sintering the first dielectric layer, a step of forming a second dielectric layer on the first dielectric layer, and a step of forming a second electrode on the second dielectric layer. By forming the second dielectric layer having small crystal grain size on the first dielectric layer having large crystal grain size, the surface of the capacitor insulating layer becomes flat.

10 Claims, 2 Drawing Sheets

METHOD OF MANUFACTURING CAPACITOR INCLUDED IN SEMICONDUCTOR DEVICE AND THE CAPACITOR THEREOF

BACKGROUND OF THE INVENTION

The present invention relates to a method of manufacturing a capacitor included in a semiconductor device, more particularly, a capacitor using a ferroelectric layer or a dielectric layer having high permittivity as a capacitor insulating layer.

Recent trends demonstrate that semiconductor devices which are commonly used in consumer electronic appliances are becoming higher in density and integration. As a result, the integrated circuit patterns of these semiconductor devices are required to be miniaturized. These electronic appliances containing high density integrated semiconductor devices produce electromagnetic noise thereby generating unwanted radiation, poising serious problems. As a means for reducing this unwanted radiation capacitors having large capacitance are incorporated into the semiconductor integrated circuits using a ferroelectric layer or a dielectric layer having high permittivity.

Turning to the operation of low voltage electronic appliances and the development of nonvolatile RAMs which are capable of writing/reading signals at high speed, technological developments in the electronics industry have found a need of forming a capacitor which has a ferroeletric layer on the semiconductor integrated circuit.

Referring to the Drawings, FIGS. 2(a)–(c) illustrate a capacitor produced by the conventional method of manufacturing a capacitor by using a ferroelectric layer as a capacitor insulating layer is described. First, as shown in FIG. 2(a), a first electrode 2 composed of Pt is formed selectively by sputtering on a substrate 1. Then, as shown in FIG. 2(b), a ferroelectric layer 3 composed of $SrBi_2Ta_2O_9$ is formed on the first electrode 2, in a layer thickness range of 100 to 250 nm, by spin coating method, CVD (chemical vapor deposition) method, or sputtering method, and sintered in a temperature range of 650 to 800° C. in oxygen atmosphere. Successively, as shown in FIG. 2(c), a second electrode 4 of Pt is formed on the ferroelectric layer 3 in a thickness range of 100 to 300 nm by sputtering method, thereby forming a capacitor.

In the conventional manufacturing method, however, in order that the capacitor insulating layer may have a sufficiently high permittivity and a sufficient remanent polarization, it is necessary to form the capacitor insulating layer having a crystal grain size of about 100 nm or more. However, this grain size is too large for the necessary thickness of 200 nm as a capacitor insulating layer. Accordingly, the surface of the capacitor insulating layer becomes very rough. When the capacitor is manufactured by using such a capacitor insulating layer, the dielectric strength is low, large fluctuations occur in electric characteristics such as permittivity and remanent polarization, or breakage may occur in interconnections formed on a second electrode, and ultimately the semiconductor device incorporating such capacitor has lower reliability.

None of the conventional manufacturing methods of the capacitors and the capacitors thereof described above provides the important advantages of manufacturing a capacitor having excellent electric properties and high reliability, by flattening the surface of the capacitor insulating layer.

SUMMARY OF THE INVENTION

As pointed out above a primary object of the invention is to present a method of manufacturing a capacitor having excellent electric properties and high reliability, achieved by flattening the surface of the capacitor insulating layer.

A method of manufacturing a capacitor of the invention comprises a process which includes forming a first electrode on a substrate, forming a first dielectric layer composed of a ferroelectric material or a dielectric material having high permittivity thereon, sintering the first dielectric layer, forming a second dielectric layer on the first dielectric layer, and finally, forming a second electrode on the second dielectric layer.

Preferably, the mean crystal grain size of the material for composing the second dielectric layer is smaller than the mean crystal grain size of the material for composing the first dielectric layer; the material for composing the second dielectric layer contains an amorphous region aside from the crystal region; the second dielectric layer comprises a ferroelectric layer or dielectric layer having high permittivity of which the material is the same in principal component as the material of the first dielectric layer; and a heat treatment temperature of the second dielectric layer is set lower than the sintering temperature of the first dielectric layer. Furthermore, a ferroelectric material containing at least Bi is used as the material for composing the first dielectric layer.

Therefore, according to the invention, the first dielectric layer composed of a ferroelectric material or a dielectric material having high permittivity is sintered, and the rough surface of the first dielectric layer is covered with the second dielectric layer having the mean grain size smaller than the mean grain size of the first dielectric layer, or containing an amorphous region aside from crystal region, so that the capacitor insulating layer with a smooth surface is obtained, and thereby the dielectric strength is extremely enhanced, electric properties such as permittivity and remanent polarization are stabilized, and the reliability of the semiconductor device may be enhanced.

The invention itself, together with further objects and attendant advantages, will best be understood by reference to the following detailed description taken in conjunction with the accompanying drawings.

DETAILED DESCRIPTION OF THE INVENTION

Figure 1A:
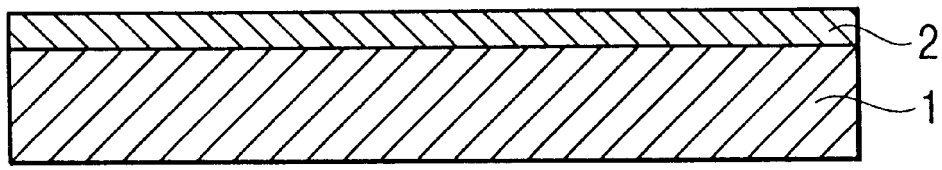
FIG. 1(a), FIG. 1(b), FIG. 1(c), and FIG. 1(d) are cross sectional views showing a capacitor in an embodiment of the invention as produced by the claimed manufacturing method.

A first embodiment of the invention is described below while referring to FIG. 1(a) to FIG. 1(d). Same components as in the conventional capacitor shown in FIG. 2 are identified with same reference numerals.

Figure 1B:
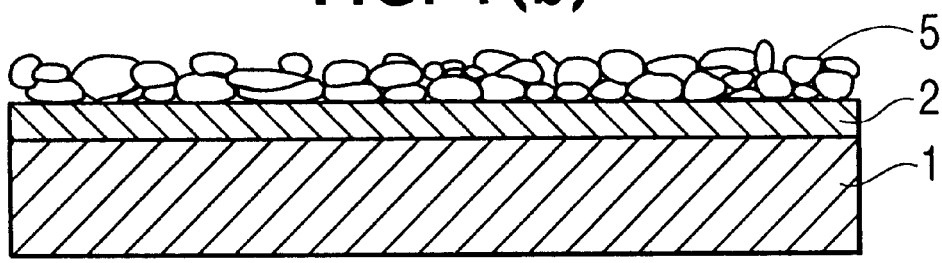
Figure 1C:
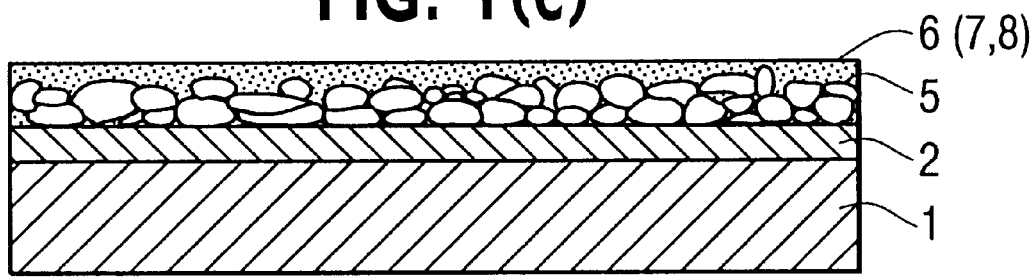
Figure 1D:
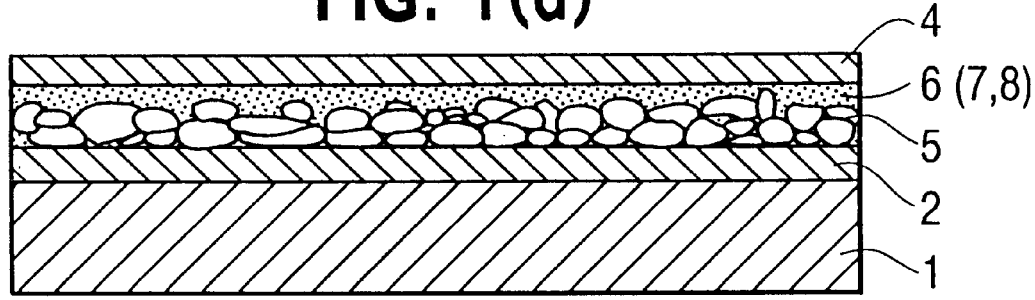
Figure 2A:
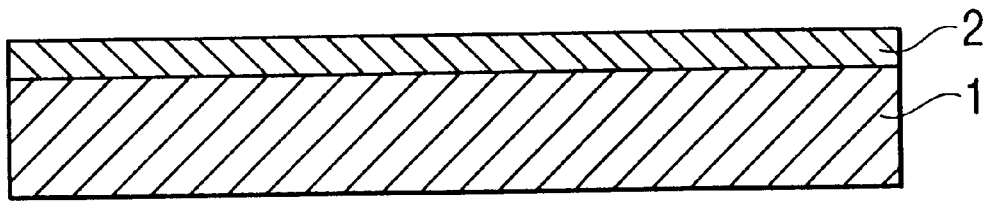
FIG. 2(a), FIG. 2(b), and FIG. 2(c) are cross sectional views showing a capacitor as known in the prior art as produced by the conventional manufacturing method.
Figure 2B:
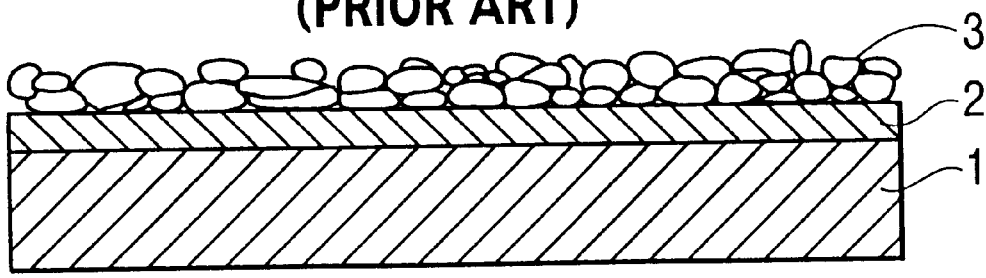
Figure 2C:
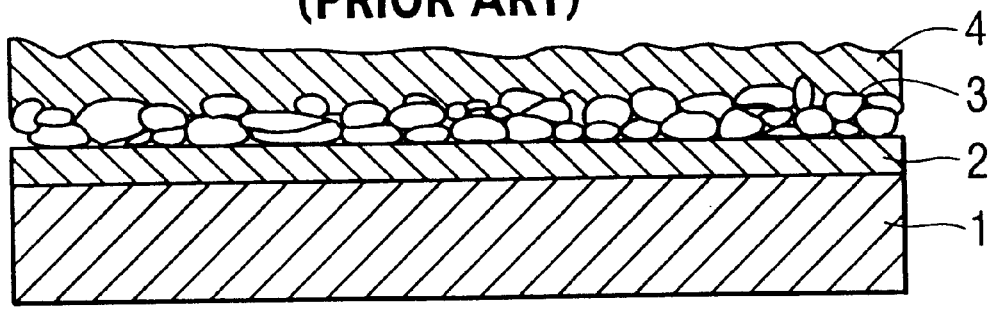

As shown in FIG. 1(a), a first electrode 2 of Pt is formed on a substrate 1 in a thickness range of 50 to 400 nm. Then, as shown in FIG. 1(b), a first dielectric layer 5 made of $SrBi_2Ta_2O_9$ is formed on the first electrode 2 in a thickness range of 50 to 250 nm by spin coating method, CVD method or sputtering method, and sintered at a temperature of 650 to 800° C. in oxygen atmosphere. Consequently, as shown in FIG. 1(c), $Ta_2O_5$ layer is formed as a second dielectric layer 6 on the first dielectric layer 5 having the surface roughened by crystallization. Finally, as shown in FIG. 1(d), a second electrode 4 of Pt in a thickness range of 50 to 300 nm is formed on the second dielectric layer 6. As a result, a capacitor is obtained.

In this way, the second dielectric layer 6 of $Ta_2O_6$, is buried in the recess of rough surface of the first dielectric layer 5 made of $SrBi_2Ta_2O_9$, so that the capacitor insulating layer composed of the first dielectric layer 5 and second dielectric layer 6 comes to have a flat surface. Meanwhile, the second dielectric layer 6 may contain an amorphous region.

In this embodiment, $Ta_2O_5$ is used as the second dielectric layer, but same effects are obtained by using other dielectric material such as $Bi_2O_3$.

A second embodiment of the invention is described below. The manufacturing process of the capacitor in this embodiment is nearly the same as in the first embodiment, and the difference from the first embodiment lies in the material of the second dielectric layer.

A first electrode 2 of Pt is formed on a substrate 1, and a first dielectric layer 5 of $SrBi_2Ta_2O_9$, is formed on the first electrode 2 and sintered at a temperature of 650 to 800° C. in oxygen atmosphere. A second dielectric layer 7 of $(Ba_xSr_{1-x})TiO_3$ is formed on the first dielectric layer 5 by spin coating method, and a second electrode 4 is formed thereon. As a result, a capacitor of the second embodiment is formed.

In this way, in the recess of the rough surface of the first dielectric layer 5 made of $SrBi_2Ta_2O_9$, the $(Ba_xSr_{1-x})TiO_3$ of the second dielectric layer 7 having smaller crystal grains than crystal grains of $SrBi_2Ta_2O_9$ is buried, so that the capacitor insulating layer composed of the first dielectric layer 5 and second dielectric layer 7 comes to have a flat surface.

In this embodiment, the second dielectric layer 7 of $(Ba_xSr_{1-x})TiO_3$ is used, but the same effects are obtained by using other ferroelectric material or high permittivity dielectric material having crystal grain size smaller than that of the first dielectric layer 5.

In yet a third embodiment of the invention, the manufacturing process of the capacitor in this embodiment is nearly the same as in the first embodiment, and the difference from the first embodiment is that the dielectric material for the second dielectric layer is the same material as the first dielectric layer, while the heat treatment method is different.

Same as in the first embodiment, a first electrode 2 of Pt is formed on a substrate 1, and a first dielectric layer 5 of $SrBi_2Ta_2O_9$ is formed on the first electrode 2 and sintered. Then, a second dielectric layer 8 of $SrBi_2Ta_2O_9$ is formed on the first dielectric layer 5 by spin coating method, CVD method or sputtering method, in a thickness range of 20 to 50 nm. After heat treatment at 600° C., a second electrode 4 is formed on the second dielectric layer 8, thereby forming a capacitor of the third embodiment.

Crystal grain size of the second dielectric layer 8 is smaller than that of the first dielectric layer 5, because the heat treatment temperature is lower than the sintering temperature. Therefore, the recess of the rough surface of the first dielectric layer 5 made of $SrBi_2Ta_2O_9$ is filled up with the $SrBi_2Ta_2O_9$ of the second dielectric layer 8 having smaller crystal grain size. As a result, the capacitor insulating layer composed of the first dielectric layer 5 and second dielectric layer 8 comes to have a flat surface.

Moreover, in this embodiment, though the heat treatment temperature of the second dielectric layer 8 is different from the sintering temperature of the first dielectric layer 5, the first and second dielectric layers are made of same material. Therefore, other equipment for depositing the second dielectric layer 8 is not needed, and hence the manufacturing process may be simplified, so that the cost may be saved. Since the same material is used, among other benefits, separation due to thermal stress or the like often occurring between the first dielectric layer and second dielectric layer will not take place.

In the first, second, and third embodiments, $SrBi_2Ta_2O_9$ of ferroelectric material is used as the first dielectric layer 5, but other ferroelectric material or dielectric material having high permittivity may also be used. In particular, when the first dielectric layer 5 is composed of ferroelectric material containing Bi, such as $Bi_4Ti_9O_{12}$, $SrBi_2Ta_2O_9$ and $SrBi_2Nb_2O_9$, since their grain size is larger than that of other dielectric material, the dielectric strength of the capacitor manufactured by the invention is extremely enhanced. In the foregoing embodiments, Pt film is used as the material for the first electrode and second electrode of the capacitor, but same effects may be obtained by using Pd or other metal, or $RuO_2$ or other conductive oxide.

Of course, it should be understood that a wide range of changes and modifications can be made to the preferred embodiment described above. It should be understood that it is the following claims, including all equivalents, which are intended to define the scope of this invention.

What is claimed is:

1. A method of manufacturing a capacitor comprising the steps of:
    forming a first electrode on a substrate;
    forming a first dielectric layer of one of a ferroelectric material and a dielectric material having high permittivity on the first electrode;
    sintering the first dielectric layer;
    forming a second dielectric layer on the first dielectric layer subsequent to said sintering of said first dielectric; and
    forming a second electrode on the second dielectric layer, wherein the mean crystal grain size of a material of the second dielectric layer is smaller than the mean crystal grain size of the material of the first dielectric layer.

2. The method of manufacturing a capacitor of claim 1, wherein the material of the second dielectric layer contains an amorphous region aside from a crystal region.

3. The method of manufacturing a capacitor of claim 1, wherein a principal component of a material of the second dielectric layer is same as a principle component of the material composing the first dielectric layer.

4. The method of manufacturing a capacitor of claim 1, further comprising a step of heating the second dielectric layer,
    wherein a heating temperature of the heating step is lower than a sintering temperature of the sintering step.

5. The method of manufacturing a capacitor of claim 1, wherein the material of the first dielectric layer is a ferroelectric material containing bismuth.

6. A method of manufacturing a capacitor comprising the steps of:
    forming a first electrode on a substrate;
    forming a first dielectric layer of one of a ferroelectric material and a dielectric material having high permittivity on the first electrode;
    sintering the first dielectric layer;

forming a second dielectric layer on the first dielectric layer;

forming a second electrode on the second dielectric layer; and heating the second dielectric layer, wherein a heating temperature of the heating step is lower than a sintering temperature of the sintering step.

7. The method of manufacturing a capacitor of claim 6, wherein the material of the second dielectric layer contains an amorphous region aside from a crystal region.

8. The method of manufacturing a capacitor of claim 6, wherein a principal component of a material of the second dielectric layer is same as a principle component of the material composing the first dielectric layer.

9. The method of manufacturing a capacitor of claim 6, wherein the material of the first dielectric layer is a ferroelectric material containing bismuth.

10. A method of manufacturing a capacitor comprising the steps of:

forming a first electrode on a substrate;

forming a first dielectric layer of one of a ferroelectric material and a dielectric material having high permittivity on the first electrode;

sintering the first dielectric layer;

forming a second dielectric layer on the first dielectric layer; and forming a second electrode on the second dielectric layer, wherein the material of the first dielectric layer is a ferroelectric material containing bismuth, and the material of the second dielectric layer contains an amorphous region aside from a crystal region.

* * * * *